United States Patent [19]

Kühn

[11] Patent Number: 5,148,114
[45] Date of Patent: Sep. 15, 1992

[54] FM DEMODULATOR

[75] Inventor: Hans-Jürgen Kühn, Buchholz, Fed. Rep. of Germany

[73] Assignee: U.S. Philips Corporation, New York, N.Y.

[21] Appl. No.: 782,046

[22] Filed: Oct. 24, 1991

[30] Foreign Application Priority Data

Oct. 26, 1990 [DE] Fed. Rep. of Germany ....... 4034050

[51] Int. Cl.⁵ .............................................. H03D 3/00
[52] U.S. Cl. .................................. 329/341; 329/342; 329/343
[58] Field of Search ............... 329/315, 341, 342, 343; 455/205, 337; 307/510, 519

[56] References Cited

U.S. PATENT DOCUMENTS 4,656,431 4/1987 Chapman ........................ 329/343 X Primary Examiner—David Mis
Attorney, Agent, or Firm—Edward W. Goodman

[57] ABSTRACT

For an integratable FM demodulator which has an optimal noise behavior and does not require any balancing, the demodulator includes a marker pulse generator (2) having an integrator (22) which is succeeded by a comparator (23), while at the start of each positive and/or negative edge of the limited FM signal, a marker pulse is started and one of a first and second reference signals is applied to the integrator input until a predetermined edge of the reference clock signal appears, and the first and a second reference signals are subsequently applied alternately to the integrator input in dependence upon a reference clock signal applied to the marker pulse generator, the two reference signals being applied to the integrator input during the desired period of time of the marker pulse, each time during equal overall time intervals, and a comparison voltage occurring at the integrator output at the end of the desired period of time, which comparison voltage is detected by the comparator (23), whereupon the started marker pulse is ended.

6 Claims, 1 Drawing Sheet

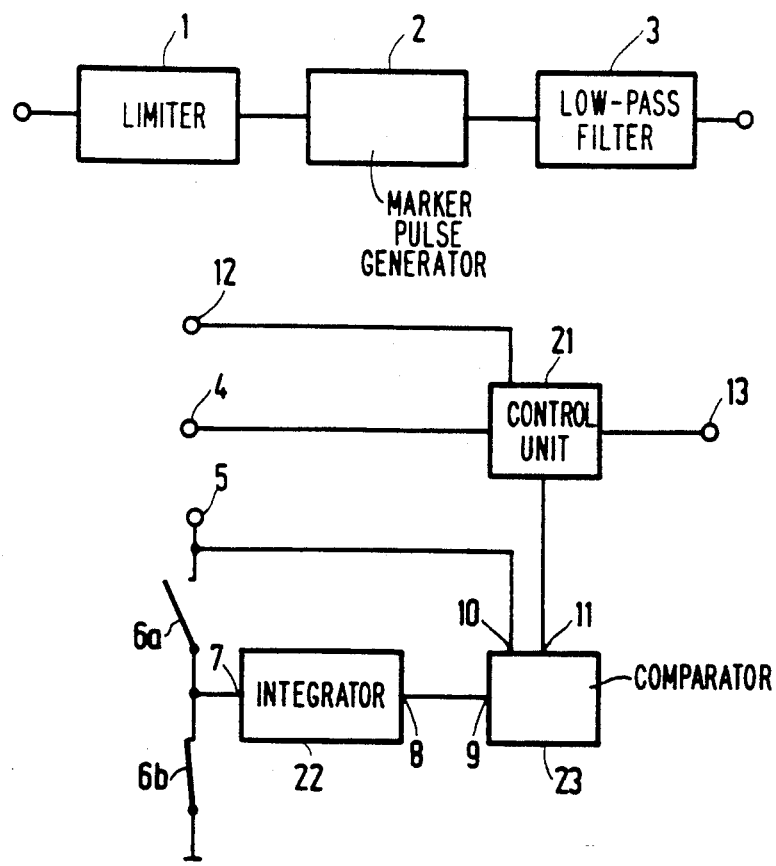
FIG.1
FIG.2
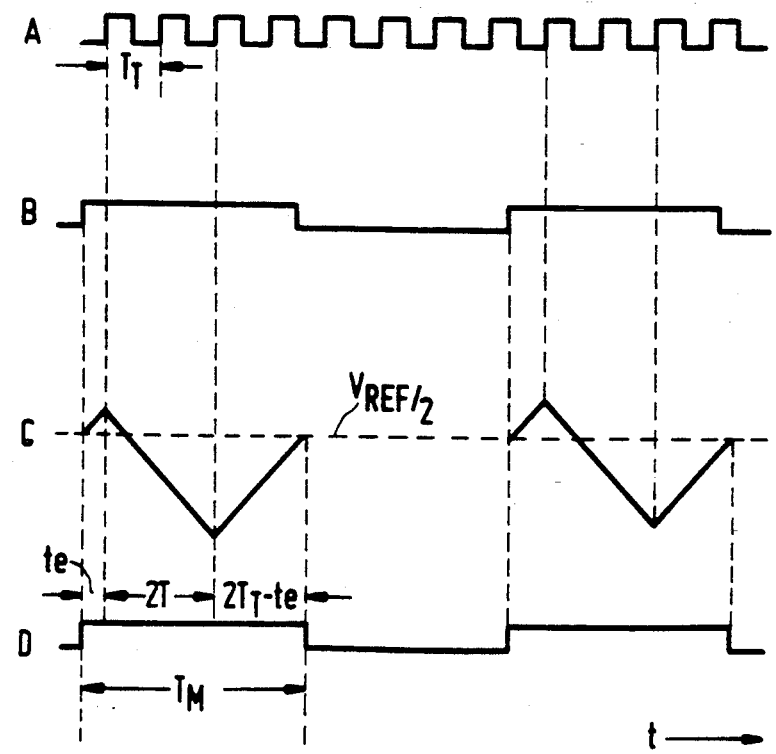
FIG.3

FM DEMODULATOR

BACKGROUND OF THE INVENTION

1. Field of the Invention

The invention relates to an FM demodulator comprising a limiter in which a frequency-modulated FM signal to be demodulated is limited, and a marker pulse generator generating marker pulses in dependence upon the limited FM signal, the marker pulses being applied to a low-pass filter whose output signal represents the demodulated signal.

In such FM demodulators the marker pulse generator is used to mark the zero crossings in the limited FM signal. Either all zero crossings are characterized by a marker pulse or only those which occur at a positive or negative edge of the limited FM signal. These marker pulses should possibly always have the same width in order that they cause minimal noise. The marker pulses are subsequently applied to a low-pass filter at whose output a signal occurs which is quasi a measure of the distance between the different marker pulses, thus also for the modulation frequency of the FM signal.

2. Description of the Related Art

The prior-art marker pulse generators can essentially be classified in two groups.

In the first group of these marker pulse generators, a monostable multivibrator, generally referred to as monoflop, is used for generating the marker pulses. In this case the requirement that the marker pulses should possibly always have the same width is satisfied, but such monoflops cannot be integrated in an IC with sufficient accuracy, as in the IC processes, both resistors and capacitors, by means of which the time constants for such a monoflop are generated, may exhibit considerable fluctuations of their values. For example, resistance fluctuations of ±20% for resistors and capacitance fluctuations of ±10% for capacitors should be taken into account. Overall, a time constant fluctuation of approximately 30% results in the case of IC manufacture. Temperature effects are then not taken into account. For the output signal of the FM demodulator, this means that, dependent on the specimen and spread in manufacture, values occur which differ by ±3 dB, which is not acceptable for most applications. An FM demodulator whose marker pulse generator operates with a monoflop is known, for example, from the handbook "Taschenbuch der Hochfrequenztechnik, Springer Verlag, 1969, pp. 018 to 019".

In a second group of FM demodulators, the marker pulse generator is implemented in such a way that clock pulses of a fixed reference clock signal are counted. After the occurrence of an edge of the limited FM signal, a marker pulse is started at the next pulse of the reference clock signal, the duration of this marker pulse being ended after a predetermined number of clock pulses of the reference clock signal. The drawback of this solution is that the marker pulses are not set right at the start of the edge of the limited FM signal but only when after the occurrence of this edge the next pulse of the reference clock signal occurs. Thus, the marker pulses have different positions, or in other words, they fluctuate with respect to their phase position. Due to this fluctuating phase position of the individual marker pulses, additional noise in the FM demodulator is generated, which noise cannot even be eliminated by means of alignment. Such an FM demodulator is known from the publication "IEEE Journal of Solid-State Circuits", vol. SC-21, no. 6, December 1986, pp. 916 to 922.

SUMMARY OF THE INVENTION

It is an object of the invention to provide an FM demodulator of the type described in the opening paragraph which is integratable and simultaneously has a possibly satisfactory noise behavior.

According to the invention this object is achieved in that the marker pulse generator comprises an integrator which is succeeded by a comparator, in that at the start of each positive and/or negative edge of the limited FM signal, a marker pulse is started and a first reference signal is applied to the integrator input at least until the next positive or the next negative edge of a reference clock signal appears, in that the first reference signal and a second reference signal are subsequently applied to the integrator input in dependence upon the reference clock signal in such a predetermined sequence that the signals applied to the integrator in the course of the sequence result after integration, into a value of zero and in that within said sequence the first reference signal is finally applied to the integrator input, and in that the marker pulse is terminated, the running predetermined sequence is interrupted and the signal applied to the integrator input is switched off as soon as the comparator detects at the integrator output that a comparison voltage present at the integrator output before the start of the marker pulse is reached again.

The marker pulse generator comprises an integrator and a subsequent comparator. Furthermore, there are two reference signals which may have different values but are each time constant. In the marker pulse generator one of the two reference signals may alternatively be applied to the integrator input. Moreover, it is possible to apply temporarily neither of the two reference signals to this input.

Dependent on whether a marker pulse is to be generated with each positive edge, each negative edge or each edge of the limited FM signal, a marker pulse is immediately started by the marker pulse generator when such an edge occurs. Simultaneously, the first reference signal is applied to the integrator input.

The marker pulse generator receives a reference clock signal whose clock frequency is stable. Dependent on this reference clock signal, the first reference signal is applied to the integrator input at least until the next positive or negative edge of the reference clock signal appears. Subsequently, also in dependence upon this reference clock signal, the two reference signals are applied to the integrator input in a predetermined sequence. Care should be taken that the two reference signals are never applied to the input simultaneously. It is possible that temporarily neither of the two reference signals is applied to the integrator input. This predetermined sequence in which the two reference signals are applied to the integrator input should be such that the voltage occurring at the integrator output after the end of the sequence is the same as that occurring at the start of the predetermined sequence. Within the sequence, the first reference signal is finally applied to the integrator input. As already before the start of this sequence, the first reference signal is applied to the integrator input until the first positive or negative edge of the reference clock signal occurs, the comparison voltage is reached at the end of the predetermined sequence at an earlier instant than would be in conformity with the predetermined sequence. How much earlier this comparison voltage is reached again depends on the period of time during which the first reference signal has been applied to the integrator input until the first edge of the reference clock signal is reached. If this period of time is substantially zero in the one limit case, the comparison voltage is actually reached again at the end of the predetermined sequence. However, if this period of time substantially has the duration of one period of the reference clock signal in the other limit case, it is during the predetermined sequence about the same period earlier that the comparison voltage is reached.

In each case the marker pulse which has already been started is ended at the instant when the comparator has detected that the voltage at the integrator output has reached the comparison voltage again. Furthermore, none of the reference signals is applied to the integrator input, so that the running sequence is interrupted.

In this implementation of the FM demodulator and its marker pulse generator, the duration of the marker pulse is only defined by the predetermined sequence. Since this predetermined sequence is dependent on the reference clock, whose clock frequency is stable, the marker pulses always have a constant width. Moreover, the marker pulses always start in the desired manner with the positive and/or negative of the limited FM signal. The time interval from the start of the relevant edge of the limited FM signal and thus from the start of the marker pulse until the appearance of the next positive or negative edge of the reference clock signal is quasi compensated again at the end of the predetermined sequence in that the comparison voltage is reached again by the same period of time before the end of the originally provided sequence. The time interval between the start of the marker pulse and the next positive or negative edge of the reference clock signal is thus compensated time and again, independently of its value and has no influence on the duration of the marker pulse. It can be specified whether the sequence should always start with the next positive or always with the next negative edge of the reference clock signal.

It is to be noted that the form of the sequence in which the reference signals are applied to the integrator input is absolutely unimportant when the conditions described are taken into account. Only the above-described conditions should be fulfilled. It is inter alia also possible to maintain the first reference signal applied to the integrator input at the start of the sequence and to apply no signal to the integrator input by switching off said first reference signal or to change over to the reference signal after a predetermined number of edges of the reference clock signal.

As far as the values of the reference signals in relation to the comparison voltage is concerned, there are fundamentally different possibilities, whereby the values of the reference signals respectively, their difference with regard to the comparison voltage may differ. However concerning the period of time during which the reference signals are applied to the integrator input, the differences with respect to the comparison voltage should be taken into account. If the two reference signals are formed in such a way that the output signal changes with the same time constant whenever the reference signals are applied to the integrator input, there should be such a predetermined sequence that the reference signals are applied to the integrator input during an equal, overall period. If the two reference signals are, however, formed in such a way that, for example, the output voltage changes with half the time constant when the first reference signal is applied as compared with the situation when the second reference signal is applied, the first reference signal should be applied to the integrator input during the predetermined sequence for a period of time which is half as long as the period of time the second reference signal is applied to the integrator input.

If in an exemplary case the two reference signals are formed in such a way that the output voltage changes with the same slope but with different signs when they are applied to the integrator input, and if the marker pulses have a width of, for example, eight periods of the reference clock signal, there is a multitude of possibilities of applying the reference signals to the integrator input. A relatively simple possibility is, for example, to apply initially a first one of the two reference signals to the integrator input after the first edge of the limited FM signal has occurred and after the start of the marker pulses until the next positive edge of the reference clock signal occurs. From this edge onwards the other reference signal could then, for example, be applied in the given form during a period of four clocks or periods of the reference clock signal. After these four periods of the reference clock signal the first reference signal is again applied to the integrator input. After this reference signal has been applied to the integrator input, the comparison voltage at whose occurrence the comparator supplies a detector signal terminating the started marker pulse is reached again after a time interval covering four periods of the reference clock signal minus the time interval which has elapsed between the start of the marker pulses and the supply of the second reference signal to the integrator input. Furthermore, the running predetermined sequence is interrupted and no signals are applied to the integrator input.

In this exemplary case, in which the marker pulses have a width of eight periods of the reference clock signal, it is, however, alternatively possible to apply the second reference signal within the predetermined sequence during two periods of the reference clock signal, subsequently to apply none of the two reference signals during four periods of the reference clock signal and then again to apply the first reference signal until the comparison voltage has been reached. Moreover, it is of course also possible to switch more than once between the two reference signals within the predetermined sequence, but then care should be taken that the comparison voltage does not occur at the integrator output before the end of the marker pulse has been reached.

The FM demodulator according to the invention has a favorable noise behavior, because the marker pulses have the same width and also a constant phase position. It provides the further advantage that the position and duration of the marker pulses is not dependent on time constants which are present in the circuitry of the FM demodulator. Differing time constants of the integrator only have the effect that the output signal changes in a differently rapid way. However, since the two reference signals are alternately applied to the integrator input, these effects neutralize each other so that the duration of the marker pulses is not dependent on differing time constants in the integrator.

Based on the linear characteristic curves occurring at the output of the low-pass filter, the FM demodulator not only has a very good noise behavior but also a very good distortion behavior. Furthermore, this FM demodulator can be used at FM carrier frequencies up to more than 10 MHz. Since the insensitivity to differing time constants leads to a complete freedom of balancing the FM demodulator, it is also suitable for measuring equipment in addition to its use for demodulating audio signals, for example, in television signals or for demodulating video recorder signals.

In one embodiment of the invention, the two reference signals represent fixed reference potentials whose values are equidistantly above or below the comparison voltage and which are applied to the integrator input in the predetermined subsequence during equal overall time intervals.

If the two reference signals are fixed reference potentials and if one of the reference potentials is below the comparison voltage by a value which is the same as that by which the other reference potential is above the comparison voltage, the output voltage of the integrator each time changes with the same time constant, though with reversed signs. In this particular case, the predetermined sequence is to be formed in such a way that the two reference potentials in this sequence are applied to the integrator input during equal overall time intervals. As already explained hereinbefore, this can be effected in arbitrary alternations and also with pauses, but the above-mentioned condition should be fulfilled.

In a further embodiment of the invention the two reference signals are generated by means of constant current sources which supply currents of equal value but of different sign, in that the comparison voltage has the value of zero and the constant current sources are connected to the integrator input in the predetermined sequence during equal overall time intervals.

The reference signals may alternatively be constant currents which are generated by means of constant current sources. These currents must have different signs but as regards their value they are fundamentally optional in so far as the periods during which they are applied to the integrator input during the predetermined sequence should be in a reverse proportion to the amounts of their values. If in the simplest case the two constant current sources are chosen to be such that they have the same value but a different sign and if the comparison voltage has the value of zero, the constant current sources should be connected to the integrator input in the predetermined sequence during equal overall time intervals.

In a further embodiment of the invention, a new marker pulse is started at each edge of the limited FM signal. This provides the particular advantage that the low-pass filter should have fewer steep slopes because the interference components in the signal applied to the low-pass filter and generated by the marker pulses themselves are further remote in frequency from the useful signal which is to be supplied from the output of the low-pass filter and which quasi represents a kind of temporal mean value of the marker pulses and the pauses occurring between these pulses.

In a further embodiment of the invention, a new marker pulse is started at the start of each edge of the limited FM signal and the first reference signal is applied to the integrator input, while subsequently within the predetermined sequence, with the next edge of the reference clock signal, the second reference signal is applied to the input of the integrator for the period of a predetermined number of clock pulses of the reference clock signal and subsequently the first reference signal is applied again, and the marker pulse is terminated as soon as the comparator detects that the output signal of the integrator has reached the comparison voltage.

As already explained hereinbefore, there are a great many different methods by which the two reference signals can be applied to the integrator input after the start of a marker pulse. The simplest method is, however, the one in which after the start of a marker pulse, within the predetermined sequence initially a first reference potential is applied and in that at the start of the next positive edge of the reference clock signal, the second reference potential is applied to the integrator input. This is effected during the period of a predetermined number of clocks of the reference clock signal. Subsequently, the first reference potential is applied again within the predetermined sequence. As soon the comparator detects that the output signal of the integrator has reached the comparison voltage, the marker pulse is ended and the running sequence is interrupted.

If in this example the marker pulse has a width of six periods of the reference clock signal, it is, for example, possible to switch to the second reference potential, within the sequence during three periods of the reference clock signal and subsequently to switch to the first reference potential again.

In a further embodiment of the invention, the first reference signal can be applied to the input of the integrator via a first switch and the second reference signal can be applied to said input via a second switch, in that the first switch is closed at the start of each marker pulse, in that when the next positive edge of the reference clock signal is reached, the first switch is opened and the second switch is closed within the predetermined sequence for the period of a predetermined number of clocks, in that subsequently the second switch is opened again and the first switch is closed and in that the first switch is opened again when the comparison voltage is reached at the end of the marker pulse.

Switching the integrator input to the two reference signals can be performed by means of simple switches, particularly electronic switches.

BRIEF DESCRIPTION OF THE DRAWING

An embodiment of the invention will be described in greater detail with reference to the drawing, in which:

FIG. 1 is a block-schematic diagram of an FM demodulator including a marker pulse generator;

FIG. 2 is a block-schematic diagram of a marker pulse generator in an FM demodulator according to FIG. 1; and FIG. 3 shows some signal waveforms with respect to time of the marker pulse generator of FIG. 2.

DESCRIPTION OF THE PREFERRED EMBODIMENT

An FM demodulator shown in FIG. 1 has an input and arranged subsequent thereto a limiter 1, in which limiter 1 the amplitude of an FM signal applied to the input of the FM demodulator is limited. The limiter 1 precedes a marker pulse generator 2 in which a marker pulse is generated at each edge occurring in the limited FM signal. It would also be possible to generate a marker pulse alternatively at each positive or each negative edge of the limited FM signal. The marker pulses generated by the marker pulse generator 2 are applied to a low-pass filter 3 in which the marker pulses are low-pass filtered in such a way that a time-averaged value of the marker pulses and the intermittent pauses occurs at the output of the low-pass filter 3. The higher the frequency of the signal applied to the FM demodulator, the smaller the distance between the marker pulses applied to the low-pass filter and the higher the output voltage supplied by the low-pass filter. This output voltage is thus proportional to the instantaneous frequency of the FM carrier applied to the FM demodulator.

According to the invention the marker pulse generator 2 of the FM demodulator of FIG. 1 is implemented in accordance with the block-schematic diagram shown in FIG. 2.

This marker pulse generator shown in FIG. 2 comprises a control unit 21, an integrator 22 and a comparator 23.

A limited FM signal as supplied by the FM limiter 1 in the circuit of FIG. 1 is applied to a first input 4 of the marker pulse generator. The circuit shown in FIG. 2 further has a second input 5 at which the marker pulse generator receives a fixed reference potential. The second reference potential is ground. A switch 6a is provided by means of which the reference potential supplied to the input 5 of the marker pulse generator can be switched to an input 7 of the integrator 22. By means of a second switch 6b, the second reference potential, namely ground, can be switched to this input 7 of the integrator 22. The two switches 6a and 6b are controlled by the control unit 21. The output signal occurring at an output 8 of the integrator 22 is applied to an input 9 of the comparator 23. A further input 10 of the comparator receives the fixed reference potential applied to the input 5. The comparator 23 is further connected to the control unit 21 via a control output 11. A further input 12 of the marker pulse generator shown in FIG. 2 receives a reference clock signal which has a constant frequency and has been obtained, for example, by means of a quartz oscillator (not shown). This reference clock signal is applied within the marker pulse generator to the control unit 21. An output 13 of the marker pulse generator supplies the marker pulses which it has generated.

The operation of the marker pulse generator shown in FIG. 2 and of the FM demodulator shown in FIG. 1 will now be described with reference to FIG. 3. FIG. 3 shows some signal waveforms of the FM demodulator of FIG. 1 and of the marker pulse generator of FIG. 2 with respect to time.

A first curve A in FIG. 3 shows the reference clock signal which is applied to the input 12 of the marker pulse generator of FIG. 2. This reference clock signal has a constant period $T_T$.

A curve B in FIG. 3 shows a limited FM signal occurring within the FM demodulator of FIG. 1 at the output of the FM limiter 1. This limited FM signal is applied to the input 4 of the marker pulse generator of FIG. 2.

A signal C further shown in FIG. 3 represents the output signal of the integrator 22 of the circuit of FIG. 2.

A signal denoted by D in FIG. 3 represents the marker pulses occurring at the output 13 of the marker pulse generator 2 of FIG. 2. In FIG. 1 the marker pulse generator 2 applies these marker pulses to the low-pass filter 3.

At the start of each positive edge of the limited FM signal B shown in FIG. 3, the control unit 21 in the marker pulse generator of FIG. 2 immediately starts a marker pulse, as is shown by means of curve D in FIG. 3. Simultaneously, the first switch 6a is closed (the switch 6b is open) by means of the control unit 21 so that the first fixed reference potential applied to the input 5 of the marker pulse generator is applied to the input 7 of the integrator 22. When the next positive edge of the reference clock signal A shown in FIG. 3 occurs, the switch 6a is opened again and simultaneously the switch 6b is closed. Then a predetermined sequence starts, in the course of which initially the second fixed reference potential, namely ground, is applied to the input 7 of the integrator 22 of FIG. 2. The curve C in FIG. 3 shows that the original rising output signal at the output 8 of the integrator 22 is now falling. During two periods $T_T$ of the reference clock signal A switch 6b remains closed. After this period the control unit 21 opens the switch 6b and closes the switch 6a in the further course of the predetermined sequence. The reference potential applied to the input 5 of the marker pulse generator is now present again at the input 7 of the integrator 22. The curve C of FIG. 3 shows that the output signal occurring at the output 8 of the integrator 22 now rises again.

This output signal C, which occurs at the output 8 of the integrator 22 of FIG. 2, is applied to the input 9 of the comparator 23 of FIG. 2. Further, the first fixed reference potential, which is present at the input 5, is applied to the comparator 23 of FIG. 2. In the comparator 23 of FIG. 2, this reference potential is reduced to half the value in a manner not further shown in the Figure. This half value of the reference potential represents the comparison voltage with which the output signal supplied by the integrator 22 is compared in the comparator 23. As soon as this output signal (signal C of FIG. 3) reaches half the reference voltage, the comparator 23 of FIG. 2 applies a corresponding signal to the control unit 21 which thereupon opens the switch 6a, terminates the started marker pulse and interrupts the running predetermined sequences, in accordance with which the first reference potential should still remain applied to the integrator input 7. This is illustrated by the curve D in FIG. 3, which curve represents the generated marker pulses.

FIG. 3 shows two marker pulses both of which have the period $T_M$. For the first marker pulse of the signal D, the corresponding periods during which the different reference potentials are applied to the integrator input are marked in the curve C. During a time interval $t_e$ the first reference potential is initially applied to the integrator input until the first positive edge of the reference clock signal in accordance with curve A occurs. Subsequently, during two periods $T_T$ the reference clock signal is switched to the second reference potential. With the start of the predetermined sequence, the first reference potential is then again applied until the output voltage has been reached. This time interval covers two periods $T_T$ of the reference clock signal minus the time interval $t_e$. In accordance with the predetermined sequence, the first reference potential should remain applied during two periods $T_T$. However, as already after $2T_T - t_e$ the output signal of the integrator reaches the value of the reference potential, the started marker pulse is terminated at this instant, the running sequence is interrupted and no signals are applied to the integrator input. The time interval $t_e$ before the start of the predetermined sequence is therefore always subtracted from the sequence. As a result, the period $T_M$ of the pulse in accordance with curve D will in each case cover four periods $T_T$, independent of the interval $t_e$. This is illustrated by means of the second marker pulse in curve D of FIG. 3. In the curve C, associated with this marker pulse, of the output signal of the integrator, the interval $t_e$ is larger than in the temporally previous curve of the output signal, but simultaneously the interval $2T_T - t_e$ is correspondingly shorter so that the period $4T_T$ also results for this marker pulse. In other words, the width of the marker pulses is not dependent on the fact at which instant after the occurrence of a positive edge in the limited FM signal according to curve B the next positive edge of the reference clock signal A occurs. Also with reference to their position, the marker pulses have a constant phase because they are started each time at the start of the positive edge of the limited FM signal in accordance with curve B.

I claim:

1. An FM demodulator comprising a limiter in which a frequency-modulated FM signal to be demodulated is limited, and a marker pulse generator generating marker pulses in dependence upon the limited FM signal, said marker pulses being applied to a low-pass filter whose output signal represents the demodulated signal, characterized in that the marker pulse generator comprises an integrator which is succeeded by a comparator, in that at the start of each positive and/or negative edge of the limited FM signal, a marker pulse is started and a first reference signal is applied to the integrator input until the next positive or the next negative edge of a reference clock signal appears, in that the first reference signal and a second reference signal are subsequently applied to the integrator input in dependence upon the reference clock signal in such a predetermined sequence that the integrated signals applied to the integrator in the course of the sequence yield the value of zero, and in that within the sequence the first signal is finally applied to the integrator input, and in that the started marker pulse is terminated, the running predetermined sequence is interrupted and the signal applied to the integrator input is blocked as soon as the comparator detects that a comparison voltage present at the integrator output before the start of the marker pulse is reached again.

2. An FM demodulator as claimed in claim 1, characterized in that the two reference signals represent fixed reference potentials whose values are equidistantly above and below the comparison voltage and which are applied to the integrator input in the predetermined sequence during equal overall time intervals.

3. An FM demodulator as claimed in claim 1, characterized in that the two reference signals are generated by means of constant current sources which supply currents of equal value but of different sign, in that the comparison voltage has the value of zero and all constant current sources are connected to the integrator input in the predetermined sequence during equal overall time intervals.

4. An FM demodulator as claimed in claim 1, characterized in that a new marker pulse is started at each edge of the limited FM signal.

5. An FM demodulator as claimed in claim 1, characterized in that a new marker pulse is started at the start of each edge of the limited FM signal and the first reference signal is applied to the integrator input, in that subsequently within the predetermined sequence with the next edge of the reference clock signal the second reference signal is applied to the input of the integrator for the period of a predetermined number of clocks of the reference clock signal and subsequently the first reference signal is applied again, and in that the marker pulse is terminated as soon as the comparator detects that the output signal of the integrator has reached the comparison voltage.

6. An FM demodulator as claimed in claim 1, characterized in that the first reference signal is applied to the input of the integrator via a first switch and the second reference signal is applied to said input via a second switch, in that the first switch is closed at the start of each marker pulse, in that the first switch is opened and the second switch is closed within the predetermined sequence for the period of a predetermined number of clocks when the next positive edge of the reference clock signal is reached, in that subsequently the second switch is opened again and the first switch is closed and in that the first switch is opened again when the comparison voltage is reached at the end of the marker pulse.

* * * * *